(12) United States Patent
Duan

(10) Patent No.: US 9,030,258 B2
(45) Date of Patent: May 12, 2015

(54) OPERATIONAL TRANSCONDUCTANCE AMPLIFIER WITH INCREASED CURRENT SINKING CAPABILITY

(71) Applicant: STMicroelectronics (Shenzhen) R&D Co. Ltd., Shenzhen (CN)

(72) Inventor: Yi Jun Duan, Shenzhen (CN)

(73) Assignee: STMicroelectronics (Shenzhen) R&D Co., Ltd., Shenzhen (CN)

( * ) Notice: Subject to any disclaimer, the term of this patent is extended or adjusted under 35 U.S.C. 154(b) by 126 days.

(21) Appl. No.: 13/875,766

(22) Filed: May 2, 2013

(65) Prior Publication Data

US 2013/0314159 A1  Nov. 28, 2013

(30) Foreign Application Priority Data

May 24, 2012 (CN) .......................... 2012 1 0171001

(51) Int. Cl.
*H03F 3/45* (2006.01)
*H02H 9/04* (2006.01)

(52) U.S. Cl.
CPC ........... *H02H 9/043* (2013.01); *H03F 3/45071* (2013.01); *H03F 3/45183* (2013.01); *H03F 2203/45526* (2013.01); *H03F 2203/45674* (2013.01)

(58) Field of Classification Search
USPC .......................................... 330/253, 257, 261
IPC .......................................................... H03F 3/45
See application file for complete search history.

(56) References Cited

U.S. PATENT DOCUMENTS

| 4,779,062 | A | * | 10/1988 | Scheraga ...................... 330/298 |
| 5,594,326 | A | * | 1/1997 | Gilbert .......................... 323/313 |
| 7,053,699 | B2 | * | 5/2006 | North .............................. 327/590 |
| 7,057,444 | B2 | * | 6/2006 | Illegems ........................ 327/541 |
| 7,348,854 | B1 | * | 3/2008 | Mordkovich .................. 330/298 |
| 8,022,765 | B1 | * | 9/2011 | Oo et al. ........................ 330/285 |
| 2014/0266450 | A1 | * | 9/2014 | Talegaonkar et al. ......... 330/277 |

* cited by examiner

*Primary Examiner* — Patricia Nguyen
(74) *Attorney, Agent, or Firm* — Gardere Wynne Sewell LLP

(57) ABSTRACT

An amplifier circuit includes an input terminal and an output terminal. A current sinking transistor includes a first conduction terminal coupled to the output terminal and a second conduction terminal coupled to a reference supply node. A voltage sensing circuit has a first input coupled to the input terminal and a second input coupled to the output terminal. An output of the voltage sensing circuit is coupled to the control terminal of the current sinking transistor. The voltage sensing circuit functions to sense a rise in the voltage at the output terminal which exceeds the voltage at the input terminal, and respond thereto by activating the current sinking transistor.

20 Claims, 4 Drawing Sheets

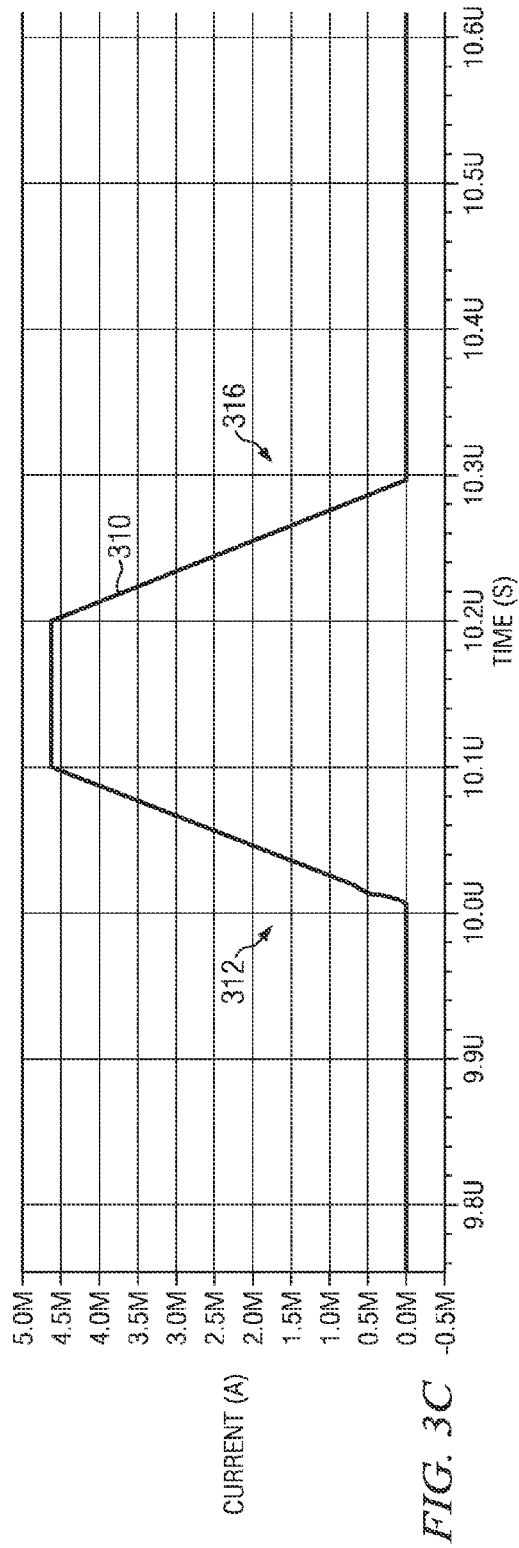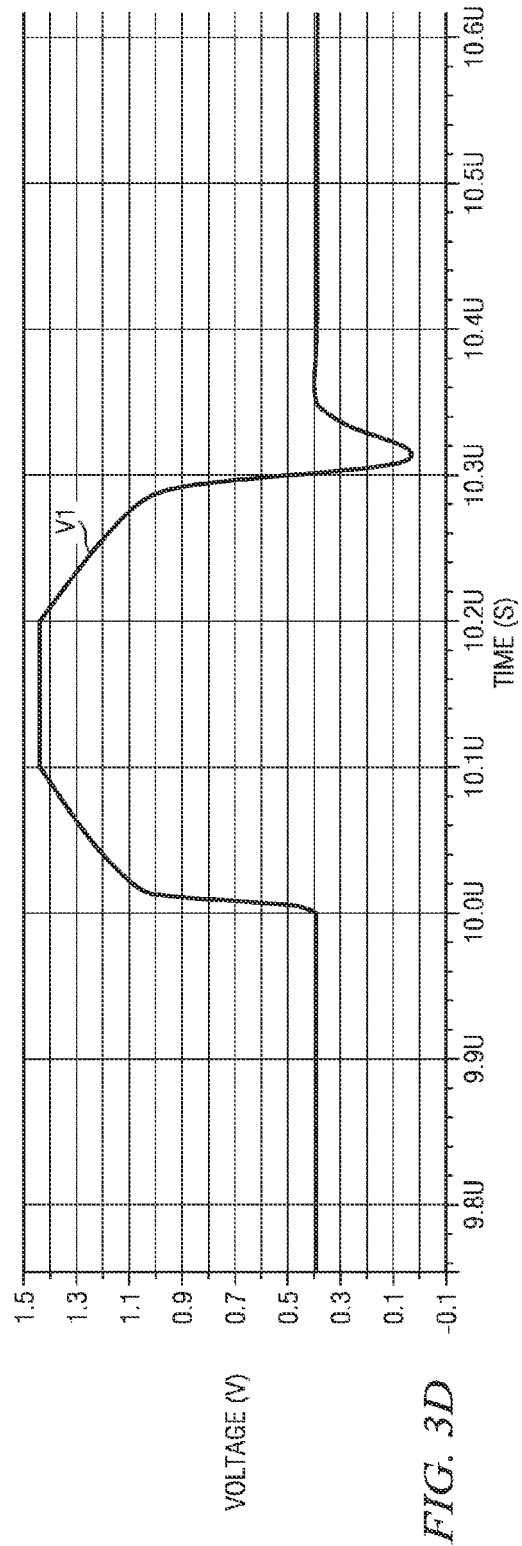

US 9,030,258 B2

OPERATIONAL TRANSCONDUCTANCE AMPLIFIER WITH INCREASED CURRENT SINKING CAPABILITY

PRIORITY CLAIM

This application claims priority from Chinese Application for Patent No. 201210171001.3 filed May 24, 2012, the disclosure of which is hereby incorporated by reference.

BACKGROUND

1. Technical Field

The present invention relates generally to amplifier circuits, and in particular to operational transconductance amplifier circuits.

2. Introduction

Reference is made to FIG. 1 which shows a circuit diagram of a conventional operational transconductance amplifier 100 configured as a non-inverting unity gain buffer.

The amplifier 100 includes differential input stage 101 including a first current source 102 functioning as a tail current source for a differential transistor pair 104 and 106. The transistors 104 and 106 comprise MOSFET transistors of the n-channel type whose source terminals are connected together at node 108. The first current source 102 is coupled between node 108 a reference node 110 (which in the illustrated circuit comprises circuit ground GND). The gate of transistor 104 is coupled to a positive input terminal IN+ of the amplifier 100. The gate of transistor 106 is coupled to a negative input terminal IN− of the amplifier 100. The differential input stage 101 further includes a load circuit formed by a pair of MOSFET transistors 114 and 116 of the p-channel type connected in a current mirror configuration. The transistor 114 has a drain terminal coupled to the drain terminal of the transistor 104 at node 120 and a source terminal coupled to a reference node 111 (which in the illustrated circuit comprises a positive supply node VDD). The transistor 116 has a drain terminal coupled to the drain terminal of the transistor 106 at node 122 and a source terminal coupled to the reference node 111. The gates of transistors 114 and 116 are connected together and to the drain terminal of transistors 104 and 114 at node 120. Node 122 forms the output of the differential input stage 101.

The amplifier 100 further includes a single-ended output stage 131. The output stage 131 includes a second current source 134 and a MOSFET transistor 136 of the p-channel type. The second current source 134 and transistor 136 are coupled in series between the reference node 111 and the reference node 110. Specifically, a source terminal of transistor 136 is coupled to the reference node 111, a drain terminal of transistor 136 is coupled to an output node 140, and the second current source 134 is coupled between the output node 140 and the reference node 110. The gate of transistor 136 is coupled to node 122 at the output of the differential input stage 101.

To implement the configuration of the amplifier 100 as a non-inverting unity gain buffer, a shunt connection 144 is made between the output node 140 and the negative input terminal IN− of the amplifier 100.

A resistor 148 and capacitor 150 are coupled in series between the output node 140 and node 122 to form a Miller compensation network.

A drawback of the amplifier 100 is that it does not respond with a satisfactory current sinking action in response to the application of a current I_sink to the output node 140. The reason for this is that the sinking current I_sink applied to output node 140 is discharged solely by the second current source 134. There is a danger that current source 134 presents an insufficient sink capability, which will result in an undesirable rise in voltage at the output node 140. This rise in voltage at the output node 140 could present a danger to downstream (for example, next stage) circuitry that is coupled to the output node.

A need exists in the art for an improved single-ended output stage circuit with enhanced current sinking capabilities.

SUMMARY

In an embodiment, a circuit comprises: an amplifier circuit having an input terminal and an output terminal; a current sinking transistor having a first conduction terminal coupled to the output terminal, a second conduction terminal coupled to a reference supply node, and a control terminal; and a voltage sensing circuit having a first input coupled to the input terminal, a second input coupled to the output terminal and an output coupled to the control terminal of the current sinking transistor.

In an embodiment, a circuit comprises: a non-inverting unity gain buffer amplifier having an input terminal and an output terminal; a current sinking transistor having a first conduction terminal coupled to the output terminal, a second conduction terminal coupled to a reference supply node, and a control terminal; and a voltage sensing circuit coupled to the control terminal and configured to activate the current sinking transistor in response to sensing a rise in a voltage at the output terminal which exceeds a voltage at the input terminal.

In another embodiment, a method comprises: buffering an input voltage through to an output voltage with unity gain; sensing a rise in the output voltage which exceeds the input voltage; and selectively sinking current from a node at the output voltage in response to said sensing.

In another embodiment, a circuit comprises: a non-inverting unity gain buffer amplifier having an input terminal and an output terminal; a current sinking transistor having a first conduction terminal coupled to the output terminal, a second conduction terminal coupled to a reference supply node, and a control terminal; a resistor coupled between the control terminal and the reference supply node; a first transistor having a first conduction terminal coupled to the control terminal and a second conduction terminal coupled to the output terminal; and a second transistor having a first conduction terminal coupled to the input terminal and a second conduction terminal configured to receive a reference current, wherein the first and second transistors are connected in a mirror-configuration.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures not drawn to scale, in which like reference numbers indicate similar parts, and in which:

FIGS. 3A-3D are waveform diagrams illustrating operation of the circuit of FIG. 2.

DETAILED DESCRIPTION OF THE DRAWINGS

Figure 2:
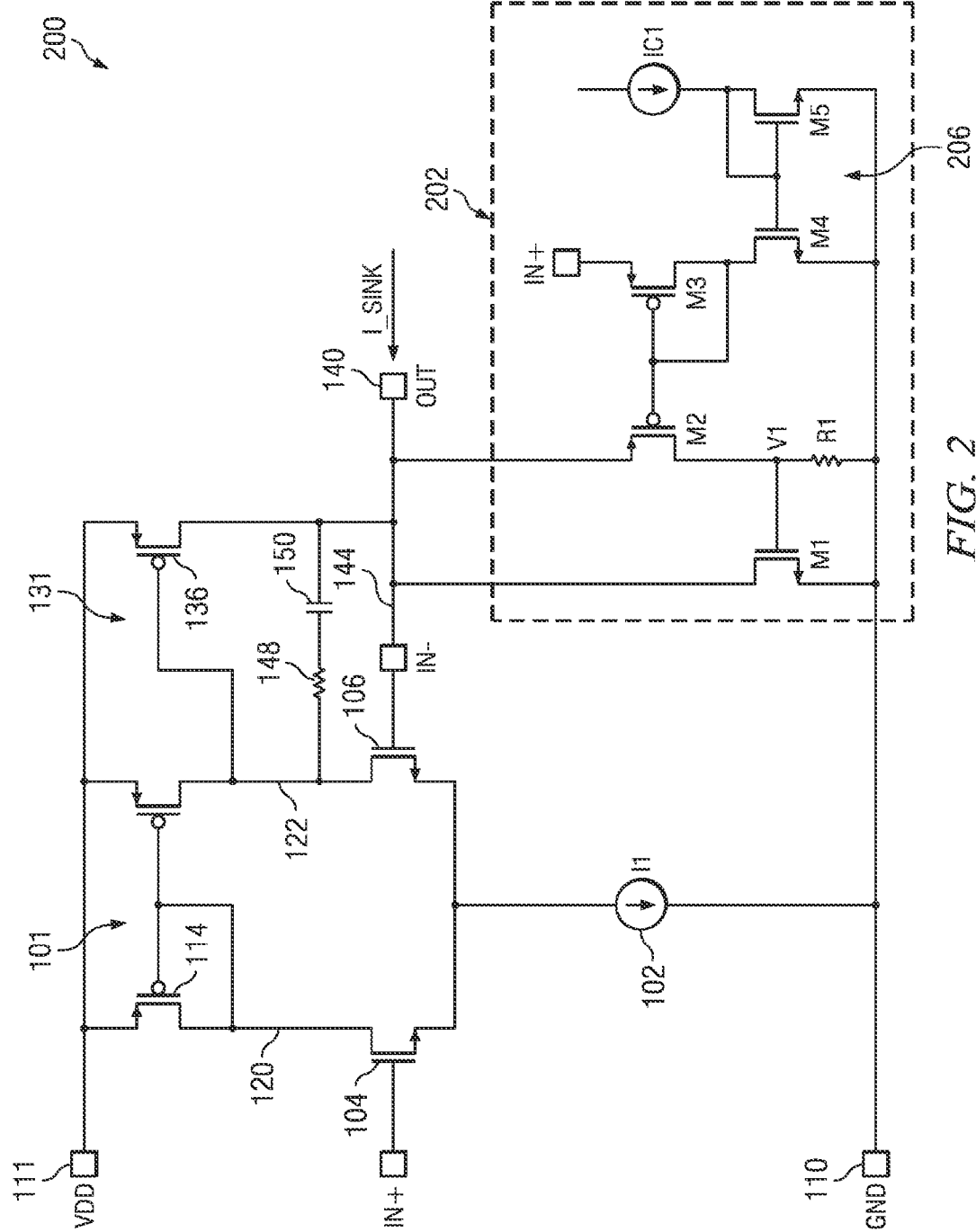
FIG. 2 is a circuit diagram of an operational transconductance amplifier with improved current sinking capabilities.

Reference is now made to FIG. 2 which shows a circuit diagram of an operational transconductance amplifier 200 with improved current sinking capabilities.

Figure 1:
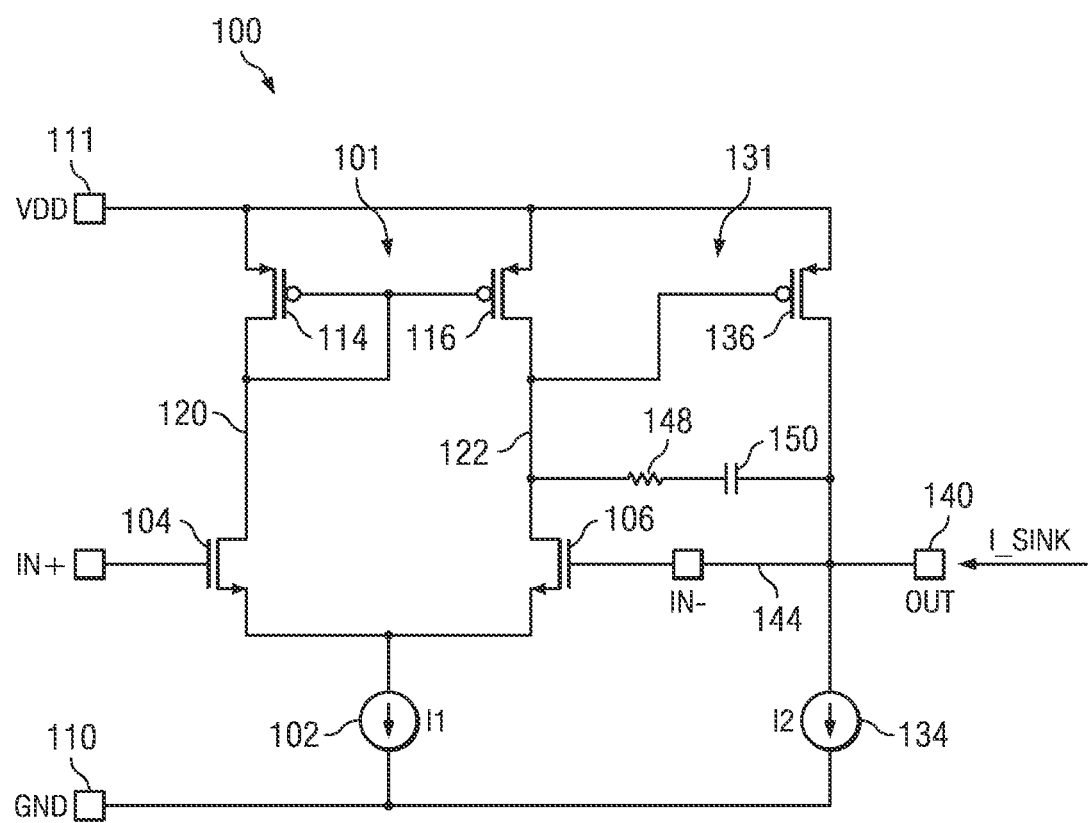
FIG. 1 is a circuit diagram of a conventional operational transconductance amplifier configured as a non-inverting unity gain buffer.

Like reference numbers in FIG. 2 refer to like components shown in FIG. 1. No further description of such components in FIG. 2 is provided here, and reference is instead made to the previous description provided herein with respect to FIG. 1.

The amplifier 200 differs from the amplifier 100 in that the second current source 134 has been replaced by a current sink circuit 202. The current sink circuit 202 includes a reference current source IC1 coupled to source current into a current mirror circuit 206 formed by transistors M4 and M5. Transistors M4 and M5 are MOSFET transistors of the n-channel type. The source terminals of transistors M4 and M5 are coupled to the reference node 110. The drain terminal of transistor M5 is coupled to receive current sourced by the reference current source IC1. The gate terminals of transistors M4 and M5 are coupled together and to the drain terminal of transistor M5. The current from reference current source IC1 is accordingly mirrored by current mirror circuit 206, with a scaling factor set by the relative sizes of transistors M4 and M5, to the drain of transistor M4.

The current sink circuit 202 further includes a pair of MOSFET transistors M2 and M3 of the p-channel type. The source terminal of transistor M3 is coupled to the positive input terminal IN+ of the amplifier 200. The source terminal of transistor M2 is coupled to the output node 140. The gate terminals of transistors M2 and M3 are coupled together and to the drain terminal of transistor M3. As the amplifier 200 is configured with shunt connection 144 in a non-inverting unity gain buffer mode of operation, the voltage at the output node 140 will typically equal the voltage at the positive input terminal IN+ of the amplifier 200. The transistors M2 and M3 accordingly function to mirror the current at the drain of transistor M2 (as received from mirror 206) to the drain of transistor M2 mirror with a scaling factor set by the relative sizes of transistors M2 and M3.

The current sink circuit 202 further includes a resistor R1 coupled between the drain of transistor M2, at an intermediate node V1, and the reference node 110.

The current sink circuit 202 further includes a MOSFET transistor M1 of the re-channel type whose gate terminal is coupled to the intermediate node V1. The drain terminal of transistor M1 is coupled to the output node 140. The source terminal of transistor M1 is coupled to the reference node 110. The circuit 202 is designed such that transistor M1 is sized to support a large current sinking capability.

The circuit 202 functions to selectively activate transistor M1 so as to better sink the current I_sink when applied to the output node 140. This selective activation is made in response to circuit 202 sensing an unacceptable rise in voltage at the output node 140 (caused by the applied current I_sink). When the applied current I_sink is zero, the circuit 202 operates in a sleep mode with transistor M1 off. In this condition, the voltage at intermediate node V1 is close to the reference node 110 voltage (e.g., ground). This sleep mode state of operation is set by the biasing circuitry formed by reference current source IC1, transistors M2-M5 and resistor R1 when the voltage at the output node 140 equals the voltage at the positive input terminal IN+ of the amplifier 200.

An increase in current I_sink applied to the output node 140 produces a corresponding increase in the voltage at the output node 140. This increases the Vgs of transistor M2, and transistor M2 will accordingly conduct additional current. The rise in current passing through transistor M2, as applied across the resistor R1, produces an increase in voltage at intermediate node V1. When the voltage at intermediate node V1 rises above the threshold voltage of transistor M1, transistor M1 turns on and sinks current from the output node 140 to the reference node 110. The sinking of current through transistor M1 causes a decrease in the voltage at the output node 140. With this decrease in output node 140 voltage, the current through transistor M2 decreases and the voltage at intermediate node V1 falls, resulting in a turn off of transistor M1. Those skilled in the art will accordingly recognize that the circuit 202 functions to respond only to spike in the current I_sink as applied to the output node 140. In all other conditions, the circuit 202 is non-operational (i.e., sleeping) and has no affect on the operation of the amplifier circuit 200.

Reference is now made to FIGS. 3A-3D which show waveform diagrams illustrating operation of the circuit of FIG. 2.

Figure 3A:
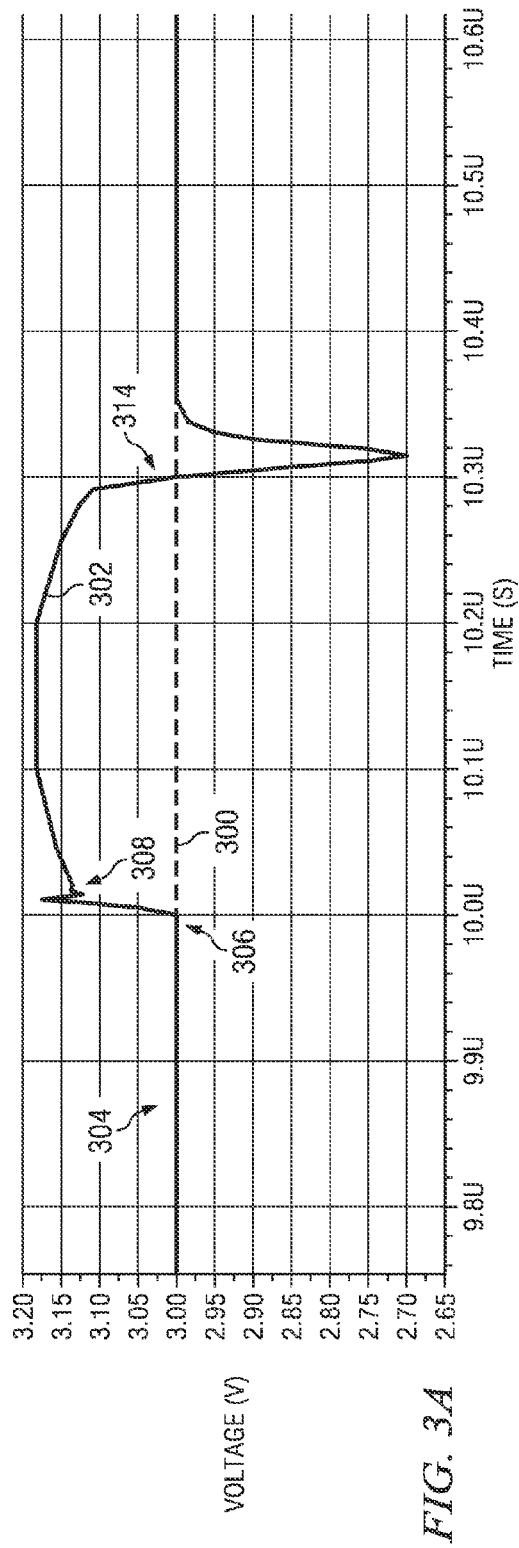
Figure 3B:
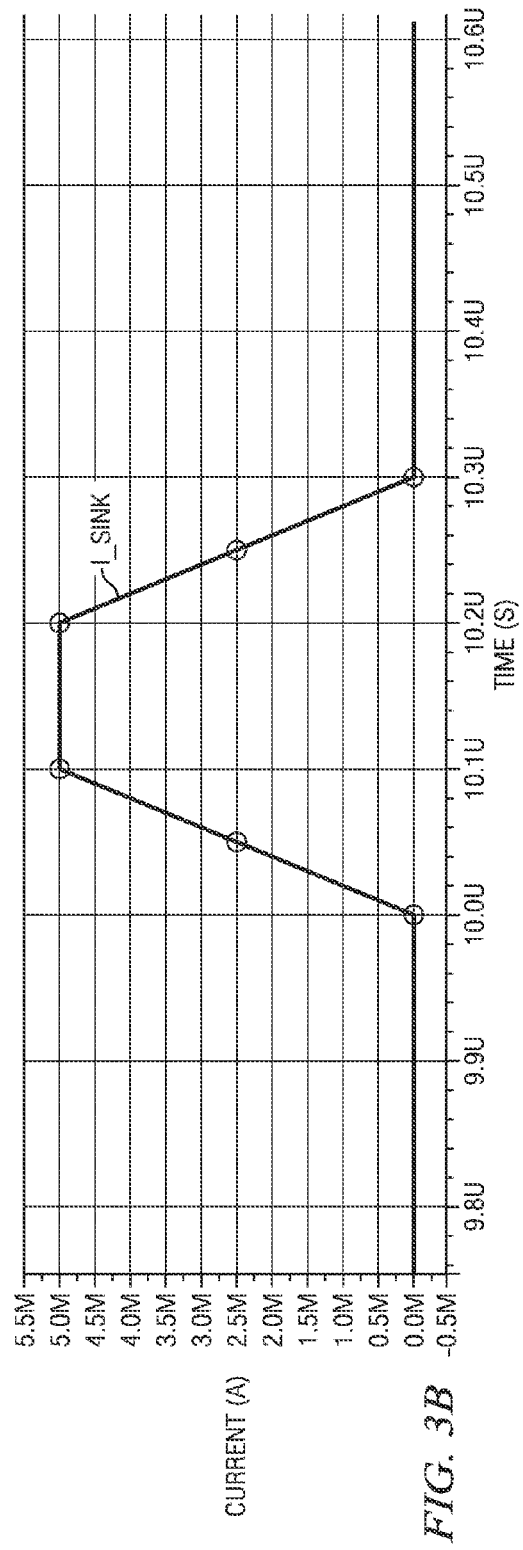

With reference to FIG. 3A, reference 300 is the voltage at the positive input terminal IN+ of the amplifier 200 and reference 302 is the voltage at the output node 140. Reference 304 shows operation of the amplifier circuit 200 in the non-inverting unity gain buffer configuration with the output voltage 302 following the input voltage 300. At time 306, a spike in sink current I_sink is applied to the output node 140. This spike in current is shown in FIG. 3B. The spike in sink current I_sink produces a corresponding increase (reference 308) in the voltage 302 at the output node 140. The circuit 202 awakes from sleep mode and responds to the voltage increase 308 by turning on transistor M1. FIG. 3D illustrates the voltage V1 at the gate of transistor M1 rising in response to the spike in sink current I_sink. FIG. 3C illustrates the current 310 through transistor M1 as a result of increasing the control voltage V1 of FIG. 3D. The activation of transistor M1 produces an increase in current (reference 312) through transistor M1 which functions to sink the applied current I_sink and reduce the voltage 302 at the output node (reference 314). As the voltage decreases 314, the circuit 202 turns off transistor M1 and the discharge current correspondingly decreases (reference 316). Once the spike 308 in voltage 302 at the output node 140 due to sink current I_sink has been addressed, the circuit 202 returns to sleep mode and operation of the amplifier in the non-inverting unity gain buffer configuration with the output voltage 302 following the input voltage 300 continues.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
an amplifier circuit having an input terminal and an output terminal;

a current sinking transistor having a first conduction terminal coupled to the output terminal, a second conduction terminal coupled to a reference supply node, and a control terminal; and a voltage sensing circuit having a first input coupled to the input terminal, a second input coupled to the output terminal and an output coupled to the control terminal of the current sinking transistor.

2. The circuit of claim 1, wherein said voltage sensing circuit is configured to sense a rise in voltage at the output terminal and respond thereto by activating the current sinking transistor to sink current from the output terminal to the reference supply node.

3. The circuit of claim 1, wherein the amplifier circuit comprises a non-inverting unity gain buffer amplifier.

4. The circuit of claim 1, wherein the amplifier circuit comprises:
a differential input stage including a positive input terminal and a negative input terminal; and
a single ended output stage.

5. The circuit of claim 4, wherein the positive input terminal is the input terminal of the amplification circuit and the negative input terminal is connected to the output terminal of the amplification circuit.

6. The circuit of claim 1, wherein the voltage sensing circuit comprises a circuit configured to bias the current sinking transistor in an off state when a voltage at the first input coupled to the input terminal is equal to a voltage at the second input coupled to the output terminal.

7. The circuit of claim 6, wherein the circuit of the voltage sensing circuit is further configured to bias the current sinking transistor in an on state when a voltage at the first input coupled to the input terminal is less than a voltage at the second input coupled to the output terminal.

8. The circuit of claim 1, wherein said voltage sensing circuit is configured to sense a voltage at the second input coupled to the output terminal exceeding a voltage at the first input coupled to the input terminal and respond thereto by activating the current sinking transistor to sink current from the output terminal to the reference supply node.

9. The circuit of claim 1, wherein said voltage sensing circuit comprises:
a first transistor having a first conduction terminal coupled to the output terminal and a second conduction terminal coupled to the control terminal of the current sinking transistor; and
a resistor coupled between the control terminal of the current sinking transistor and the reference supply node.

10. The circuit of claim 9, wherein the voltage sensing circuit further comprises:
a second transistor having a first conduction terminal coupled to the input terminal, a second conduction terminal coupled to a reference current, and a control terminal coupled to the second conduction terminal;
wherein the control terminal of the second transistor is also coupled to a control terminal of the first transistor.

11. A circuit, comprising:
a non-inverting unity gain buffer amplifier having an input terminal and an output terminal;
a current sinking transistor having a first conduction terminal coupled to the output terminal, a second conduction terminal coupled to a reference supply node, and a control terminal; and
a voltage sensing circuit coupled to the control terminal and configured to activate the current sinking transistor in response to sensing a rise in a voltage at the output terminal which exceeds a voltage at the input terminal.

12. The circuit of claim 11, wherein the current sinking transistor is a MOSFET.

13. The circuit of claim 11, wherein the voltage sensing circuit comprises a circuit configured to bias the current sinking transistor from an off state to an on state when the voltage at the input terminal is sensed less than the voltage at the output terminal.

14. The circuit of claim 1, wherein said voltage sensing circuit comprises:
a first transistor having a first conduction terminal coupled to the output terminal and a second conduction terminal coupled to the control terminal of the current sinking transistor; and
a resistor coupled between the control terminal of the current sinking transistor and the reference supply node.

15. The circuit of claim 14, wherein the voltage sensing circuit further comprises:
a second transistor having a first conduction terminal coupled to the input terminal, a second conduction terminal coupled to a reference current, and a control terminal coupled to the second conduction terminal;
wherein the control terminal of the second transistor is also coupled to a control terminal of the first transistor.

16. A method, comprising:
buffering an input voltage through to an output voltage at an output node with unity gain;
sensing a rise in the output voltage which exceeds the input voltage; and
selectively sinking current from the output node in response to said sensing.

17. The method of claim 16, wherein selectively sinking comprises biasing a current sink transistor in an on state when the output voltage is sensed to exceed the input voltage.

18. The circuit of claim 17, wherein selectively sinking further comprises otherwise biasing the current sink transistor in an off state.

19. The method of claim 16, wherein selectively sinking comprises biasing a current sink transistor from an off state to an on state is response to sensing that the output voltage exceeds the input voltage.

20. A circuit, comprising:
a non-inverting unity gain buffer amplifier having an input terminal and an output terminal;
a current sinking transistor having a first conduction terminal coupled to the output terminal, a second conduction terminal coupled to a reference supply node, and a control terminal;
a resistor coupled between the control terminal and the reference supply node;
a first transistor having a first conduction terminal coupled to the control terminal and a second conduction terminal coupled to the output terminal; and
a second transistor having a first conduction terminal coupled to the input terminal and a second conduction terminal configured to receive a reference current, wherein the first and second transistors are connected in a mirror-configuration.

* * * * *